United States Patent [19]

Mills et al.

[11] Patent Number: 5,262,990
[45] Date of Patent: Nov. 16, 1993

[54] MEMORY DEVICE HAVING SELECTABLE NUMBER OF OUTPUT PINS

[75] Inventors: Duane F. Mills; Jahanshir J. Javanifard, both of Sacramento; Rodney R. Rozman, Placerville; Kevin W. Frary, Fair Oaks; Sherif R. B. Sweha, El Dorado Hills, all of Calif.

[73] Assignee: Intel Corporation, Santa Clara, Calif.

[21] Appl. No.: 729,050

[22] Filed: Jul. 12, 1991

[51] Int. Cl.$^5$ .......................... G06F 13/00; G11C 7/00
[52] U.S. Cl. ........................... 365/189.02; 365/189.03
[58] Field of Search ...................... 365/189.01, 189.02, 365/189.03

[56] References Cited

U.S. PATENT DOCUMENTS 4,907,203  3/1990  Wada et al. .................... 365/189.03
5,091,851  2/1992  Shelton et al. ................. 365/189.02

Primary Examiner—Siegfried H. Grimm
Attorney, Agent, or Firm—Blakely, Sokoloff, Taylor & Zafman

[57] ABSTRACT

A memory device includes a memory array and a plurality of output pins. A control input is provided for receiving a control signal. The control signal can be in a first voltage state and a second voltage state. When the control signal is in the first voltage state, the memory device is in a first output mode. When the control signal is in the second voltage state, the memory device is in a second output mode. Circuitry is provided for selectively coupling the plurality of output pins to the memory array. An output mode select logic is coupled to receive the control signal for selecting the first output mode and the second output mode for the memory device. When the memory device is in the first output mode, the output mode select logic controls the circuitry to couple all of the plurality of output pins to the memory array. When the memory device is in the second output mode, the output mode select logic controls the circuitry to couple a portion of the plurality of output pins to the memory array. A method of controlling the memory device to switch between the first output mode and the second output mode is also described.

23 Claims, 7 Drawing Sheets

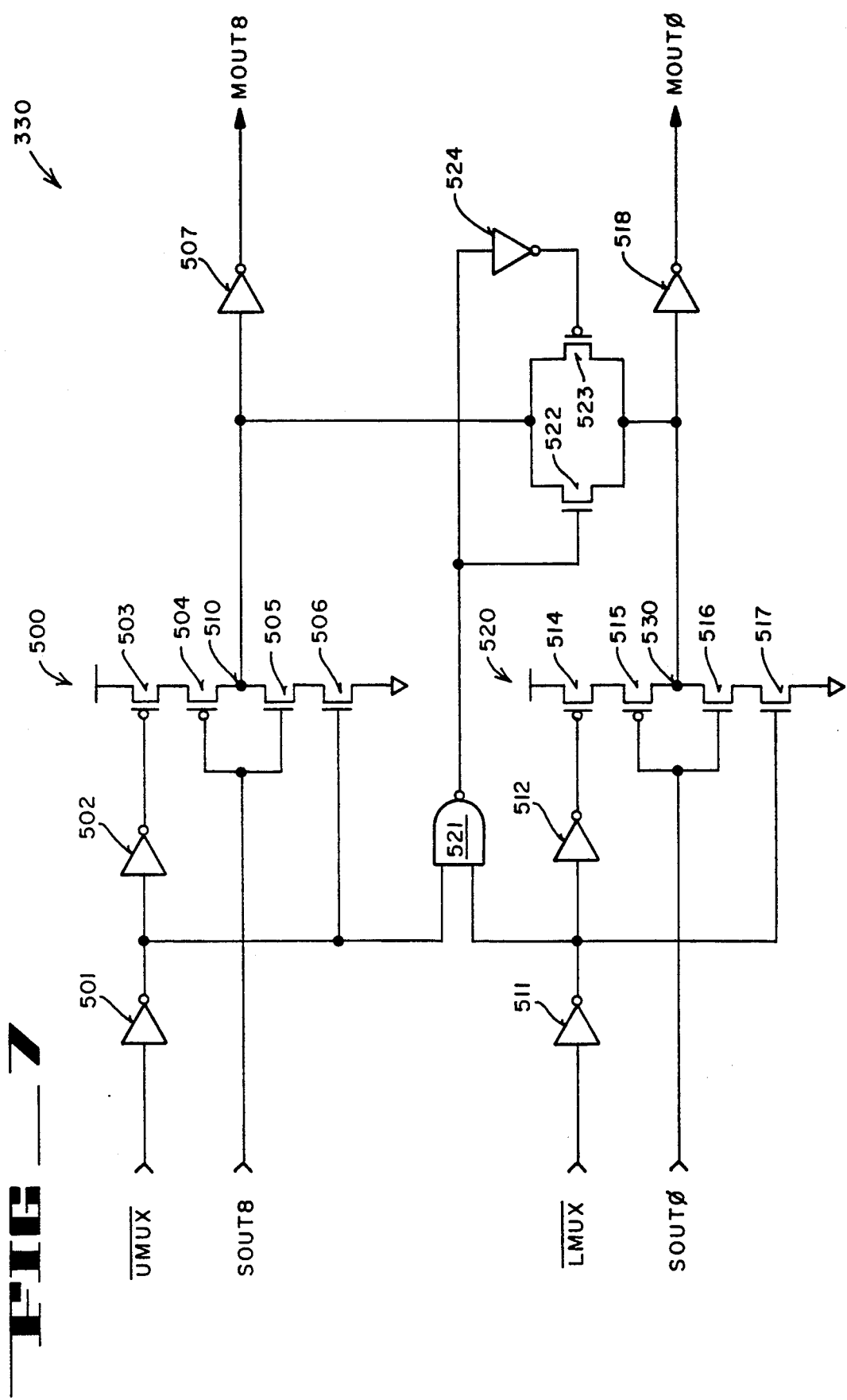
FIG.—7

MEMORY DEVICE HAVING SELECTABLE NUMBER OF OUTPUT PINS

FIELD OF THE INVENTION

The present invention pertains to the field of computer memories. More particularly, this invention relates to a memory that is fully addressable yet has an output of selectable width.

BACKGROUND OF THE INVENTION

One type of prior art nonvolatile computer memory is the Erasable Programmable Read-Only Memory ("EPROM"). The EPROM can be programmed by a user. Once programmed, the EPROM retains its data until erased. Ultraviolet light erasure of the EPROM erases the entire contents of the memory array. The memory array may then be reprogrammed with new data.

That prior EPROM typically includes a decoding circuit to address the memory array of the device. The decoding circuit receives addresses from address input pins of the EPROM. Data stored in the EPROM at the applied address can then be read via the output pins of the EPROM. The EPROM also includes a chip enable pin $\overline{CE}$ and an output enable pin $\overline{OE}$, which are two control function pins.

The prior EPROM typically includes a plurality of normal operating modes. Those normal operating modes typically include a read mode, a programming mode, and a standby mode. For a read mode, a logical low signal is applied to both of the chip enable pin $\overline{CE}$ and the output enable pin $\overline{OE}$. This permits data stored in the EPROM to be read out as addressed.

A programming mode allows data to be stored by the EPROM. To enter the programming mode, a logical high signal is applied to the output enable $\overline{OE}$ pin, a logical low signal is applied to the chip enable $\overline{CE}$ pin, and a 12 volt high voltage is applied to a Vpp pin of the EPROM. Once in the programming mode, the data applied to the EPROM is stored in memory cells of the EPROM at addresses provided from the address input pins.

A standby mode is entered by applying a Vcc voltage at the chip enable pin $\overline{CE}$ of the device. Power consumption of the EPROM is substantially reduced in the standby mode.

One category of prior EPROM has "byte wide" data output pins, which comprise 8 bits. EPROMs with byte wide output pins are typically employed in electronic systems that have a byte wide bus for data transfer.

Another category of prior EPROM has "word wide" data output pins, which comprises 16 bits. EPROMs with word wide output pins are typically employed in electronic systems that have a word wide bus for data transfer.

One disadvantage associated with the prior byte wide EPROM is that the byte wide EPROM typically cannot be used with a word wide bus.

Another disadvantage associated with the prior word wide EPROM is that when a word wide EPROM is used with a byte wide bus, one-half of the output pins of the EPROM are left floating. Moreover, only one-half of the storage capacity of the word wide EPROM is used with the byte wide bus.

SUMMARY AND OBJECTS OF THE INVENTION

One objective of the present invention is to provide a memory with an output of selectable width.

Another object of the present invention is to provide a memory having an array that is fully addressable for different output widths.

Another object of the present invention is to provide a memory wherein the output is selectively word wide or byte wide.

Another object of the present invention is to provide a memory with a variable width output, wherein the number of address pins is minimized.

A memory device is described. The memory device includes a memory array and a plurality of output pins. A control input is provided for receiving a control signal. The control signal can be in a first voltage state and a second voltage state. When the control signal is in the first voltage state, the memory device is in a first output mode. When the control signal is in the second voltage state, the memory device is in a second output mode. Circuitry means is provided for selectively coupling the plurality of output pins to the memory array. An output mode select means is coupled to receive the control signal for selecting the first output mode and the second output mode for the memory device. When the memory device is in the first output mode, the output mode select means controls the circuitry means to couple all of the plurality of output pins to the memory array. When the memory device is in the second output mode, the output mode select means controls the circuitry means to couple a portion of the plurality of output pins to the memory array.

A method of controlling the memory device to switch between the first output mode and the second output mode is also described.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 7 illustrates circuitry of one of the multiplexers shown in FIG. 5.

DETAILED DESCRIPTION

Figure 1:
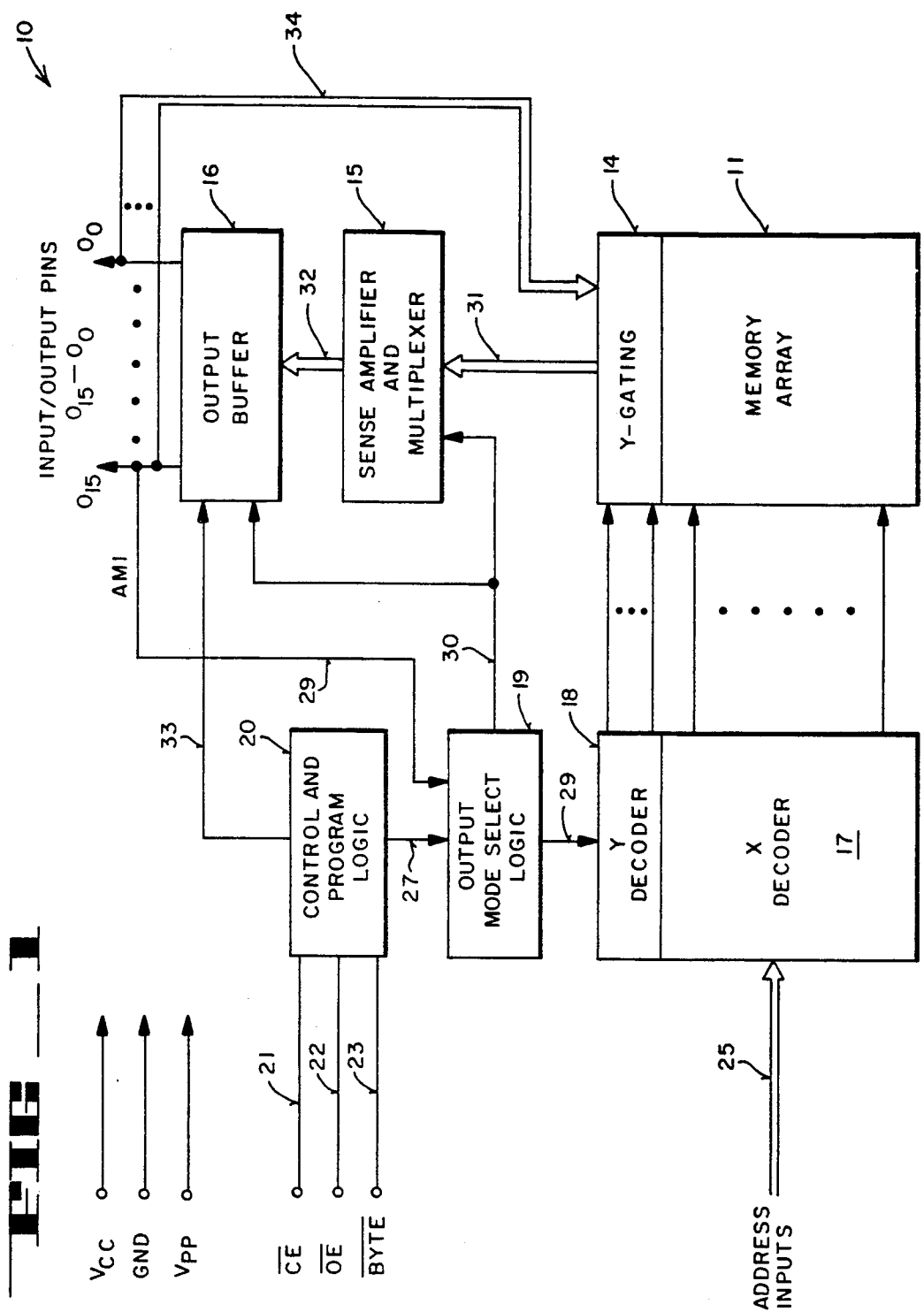
FIG. 1 is a block diagram of one preferred EPROM, and shows output mode select logic, a sense amplifier, and a multiplexer.

FIG. 1 is the block diagram of EPROM 10, which implements the preferred embodiment of the present invention. In a preferred embodiment, EPROM 10 is erasable using ultraviolet light.

In an alternative embodiment, EPROM 10 is comprised of flash memory. In other alternative embodiments, other types of memories, such as RAM, ROM, or PROM are used.

In FIG. 1, EPROM 10 includes memory array 11, which is made up of memory cells that store data at addresses. In one preferred embodiment, memory array 11 can store 4 megabits ("Mbits") of data. In another preferred embodiment, memory array 11 can store 8 Mbits of data. In alternative embodiments, memory array 11 can be smaller or larger than 4 or 8 Mbits. In a preferred embodiment, the circuitry of EPROM 10 employs CHMOS circuitry.

EPROM 10 includes sixteen output/input pins for supplying data read from memory array 11. The sixteen bit outputs $O_0$ through $O_{15}$ form the word wide output of EPROM 10.

In alternative embodiments, the outputs of EPROM 10 may be more than or fewer than sixteen bits. For example, EPROM 10 may include thirty-two bits of output.

The output/input pins $O_0$ through $O_{15}$ are coupled to an output buffer 16. Output buffer 16 is coupled to memory array 11 via (1) bus 32, (2) a sense amplifier and multiplexer 15, (3) bus 31, and (4) Y gating circuitry 14.

Output/Input pins $O_0$ through $O_{15}$ also function as input pins to supply data to memory array 11 via bus 34. For example, during a programming mode, data is supplied to memory array 11 for programming through the output/input pins $O_0$ through $O_{15}$ and bus 34.

EPROM 10 includes a number of address input pins for applying addresses to EPROM 10 for accessing memory array 11. Addresses are coupled to an X decoder 17 and a Y decoder 18 via the address input pins and an address bus 25. X decoder 17 is the row decoder for memory array 11. Y decoder 18 is the column decoder for memory array 11.

In the embodiment wherein memory array 11 is 4 Mbits in size, EPROM 10 includes eighteen address input pins. In the embodiment wherein memory array 11 is 8 Mbits in size, EPROM 10 includes nineteen address input pins. In alternative embodiments, EPROM 10 may include more or fewer address input pins.

X decoder 17 is coupled to word lines of memory array 11. X decoder 17 is a row decoder that receives X addresses from address bus 25. X decoder 17 selects one word line in accordance with each of the X addresses applied via bus 25.

Y decoder 18 is a column decoder. Y decoder 18 is coupled, via Y gating 14, to bit lines of memory array 11. Y decoder 18 receives its Y addresses from address bus 25. Y gating circuitry 14 includes column selects for memory array 11. Y gating 14 is coupled to sense amplifier and multiplexer circuitry 15.

Vpp is the program power supply voltage for EPROM 10. Vcc is the chip power supply for EPROM 10 and GND is ground. In one embodiment, Vpp is approximately 12 volts and Vcc is approximately 5 volts.

EPROM 10 includes chip enable pin $\overline{CE}$ 21 and output enable pin $\overline{OE}$ 22. Both chip enable pin $\overline{CE}$ 21 and output enable pin $\overline{OE}$ 22 are connected to control and program logic circuitry 20.

Chip enable pin $\overline{CE}$ 21 is a power enable pin and is used for device selection. When the chip enable pin $\overline{CE}$ 21 is set high at the Vcc voltage, EPROM 10 enters a standby mode. In the standby mode, power consumption by EPROM 10 is substantially reduced.

Output enable pin $\overline{OE}$ 22 is an output enable pin and is used to gate data to the output pins of EPROM 10 independent of device selection.

EPROM 10 has a plurality of operating modes. A read mode is initiated when both chip enable pin $\overline{CE}$ 21 and output enable pin $\overline{OE}$ 22 are set to the logical low state. When EPROM 10 is in the read mode, data stored in memory array 11 can be read at output pins $O_0$ through $O_{15}$. A programming mode is initiated when a 12 volt Vpp is applied to EPROM 10. When EPROM 10 is in the programming mode, data can be stored in memory array 11. EPROM 10 enters into a standby mode when a Vcc voltage is applied to chip enable pin $\overline{CE}$.

In the read mode, EPROM 10 is either in a word wide output mode or a byte wide output mode. In the word wide output mode, all output pins $O_0$ through $O_{15}$ supply data to external circuitry. In the byte wide output mode, only output pins $O_0$ through $O_7$ are enabled to supply data for output. The other half of the output pins—namely, pins $O_8$ through $O_{15}$—are tri-stated (i.e., disabled).

EPROM 10 includes an output mode selection pin $\overline{BYTE}$ 23. When a Vcc voltage is applied to $\overline{BYTE}$ pin 23, EPROM 10 goes into the word wide output mode. When ground is applied to $\overline{BYTE}$ pin 23, EPROM 10 goes into the byte wide output mode. In one embodiment, $\overline{BYTE}$ pin 23 is coupled to the Vpp line of EPROM 10 and therefore receives a Vpp voltage during the programming of EPROM 10.

The $\overline{BYTE}$ control signal on $\overline{BYTE}$ pin 23 is applied to an output mode select logic 19 via (1) control and program logic 20 and (2) line 27. Output mode select logic 19 also receives an extra address signal AM1 via line 29 from output/input pin $O_{15}$ that is disabled for the byte wide output mode. Output mode select logic 19 then applies a control signal (1) to sense amplifier and multiplexer circuitry 15 via line 30, (2) to output buffer 16 via line 30, and (3) and to Y decoder 18 via line 26. In one embodiment, the control signal from output mode select logic 19 causes sense amplifier and multiplexer circuitry 15, output buffer 16, and Y decoder 18 to operate in either the word wide or byte wide output modes.

In the absence of Vpp programming voltage being applied to EPROM 10, EPROM 10 enters the read mode when both $\overline{CE}$ pin 21 and $\overline{OE}$ pin 22 are set to a logical low value. Addresses are sent from the address input pins 25 to X decoder 17 and Y decoder 18. The output mode of EPROM 10 is then determined by the $\overline{BYTE}$ signal on pin 23, and the addressing of memory array 11 by Y decoder 18 is controlled by output mode select logic 19.

When the $\overline{BYTE}$ signal at $\overline{BYTE}$ pin 23 is at the Vcc voltage, EPROM 10 enters the word wide output mode. Output mode select logic 19 allows Y decoder 18 to select sixteen bit lines for each Y address applied. The selected bit lines are then coupled to sense amplifier and multiplexer circuitry 15 for data output via Y gating circuitry 14 and bus 31. Output mode select logic 19 also disables the multiplexing function of sense amplifier and multiplexer circuitry 15 via a signal sent on line 30. The sixteen bit data word stored in memory array 11 that has been addressed is then read out to output buffer 16 via bus 32 and made available to the external circuitry at the output/input pins $O_0$ through $O_{15}$.

When the $\overline{BYTE}$ signal at $\overline{BYTE}$ pin 23 is at ground level, EPROM 10 enters the byte wide output mode. Output mode select logic 19 disables a portion of output buffer 16 so that output/input pins $O_8$ through $O_{15}$ do not receive output data.

The extra address signal AM1 from output pin O15 is coupled to output select mode logic 19 via line 29. This is in turn causes output mode select logic 19 to have Y decoder 18 select eight bit lines (i.e., one byte) for each address applied.

The selected byte wide bit lines are then coupled to sense amplifier and multiplexer circuitry 15 via Y gating circuitry 14. The eight bit data stored in memory array 11 as addressed is read by sense amplifier and multiplexer circuitry 15 and applied to output buffer 16. Output mode select logic 19 sends a signal to circuitry 15 that causes circuitry 15 to couple the eight bit data to only the portion of output buffer 16 that is not disabled. The data is then made available to the external circuitry via output pins $O_0$ through $O_7$.

In alternative embodiments, the extra address signal AM1 may be coupled to via any one of the other output pins $O_8$ through $O_{14}$ that is disabled.

Figure 2:
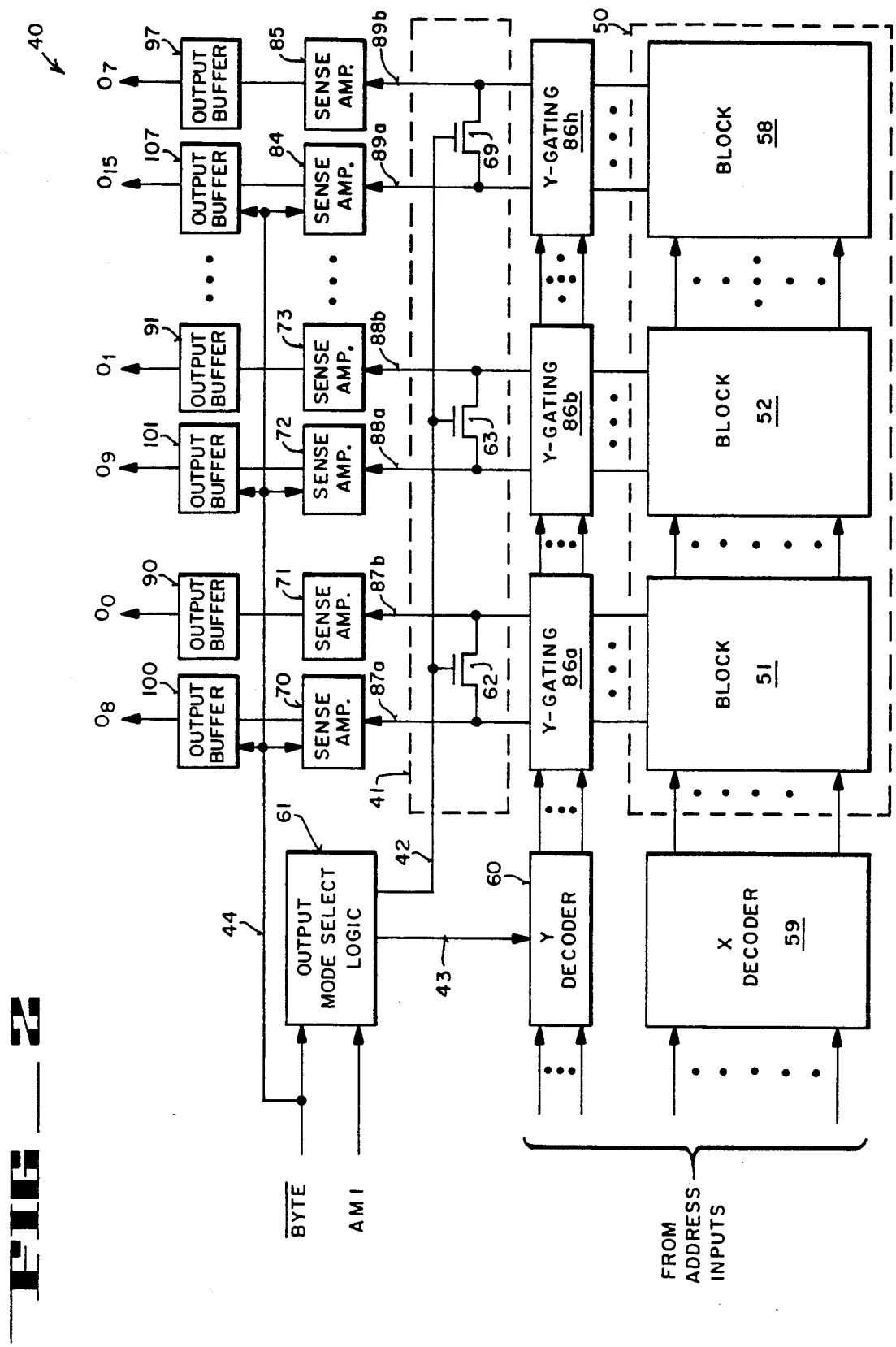
FIG. 2 is another block diagram of the EPROM of FIG. 1, and shows X and Y decoders, memory blocks, output mode select logic, sense amplifiers, output buffers, and a multiplexer.

FIG. 2 illustrates EPROM 10 in more detail. In FIG. 2, EPROM 40 includes a memory array 50 that has eight blocks 51 through 58. Blocks 51 through 58 each has its bit lines coupled to one of Y gating circuitry 86a through 86h. For example, block 51 has its bit lines coupled to Y gating circuitry 86a and block 52 has its bit lines coupled to Y gating circuitry 86b. An X decoder 59 couples word lines through all blocks 51 through 58. A Y decoder 60 is coupled to bit lines of each of blocks 51 through 58 via Y gating circuitry 86a through 86h, respectively.

Y gating circuitry 86a through 86h provides selective coupling of the bit lines of memory blocks 51 through 58 to sense amplifiers 70 through 71.

Y decoder 60 selects two bit lines from each of blocks 51 through 58 via Y gatings 86a through 86h, respectively, for each of the Y addresses applied. For example, for Y gating circuitry 86a, one bit line from block 51 is coupled to line 87a and applied to sense amplifier 70. In addition, another bit line from block 51 is coupled to line 87b and applied to sense amplifier 71.

EPROM 40 includes a multiplexer 41 between (1) Y gating circuitry 86a through 86h and (2) sense amplifiers 70 through 85. Multiplexer 41 includes eight transistors 62 through 69, each being coupled to the output lines of each Y gating circuitry. For example, transistor 62 is coupled between output lines 87a and 87b. Multiplexer 41 is controlled by output mode select logic 61, to which it is coupled via line 42. The gate of transistor 62 is coupled to line 42.

Output mode select logic 61 controls the ON and OFF state of each of transistors 62 through 69. Output mode select logic 61 turns on transistors 62 through 69 in the byte wide output mode. When transistors 62 through 69 are turned on by output mode select logic 61, the two output lines of each of the Y gating circuitry 86a through 86h are coupled to each other.

Sense amplifiers 70, 72, 74, 76, 78, 80, 82, and 84 are controlled by the $\overline{BYTE}$ signal on line 44. (Sense amplifiers 74, 76, 78, 80, and 82 are between sense amplifiers 73 and 84 and are not expressly shown in FIG. 2). Sense amplifiers 71, 73, 75, 77, 79, 81, 83, and 85 are not controlled by the $\overline{BYTE}$ signal. (Sense amplifiers 75, 77, 79, 81, and 83 are between sense amplifiers 73 and 84 and are not expressly shown in FIG. 2).

In the word wide output mode, the sense amplifiers 70, 72, 74, 76, 78,. 80, 82, and 84 are enabled by the $\overline{BYTE}$ signal to sense data from blocks 51 through 58, respectively. In the byte wide output mode, the sense amplifiers 70, 72, 74, 76, 78, 80, 82, and 84 are disabled by the $\overline{BYTE}$ signal. Data coupled to these even numbered sense amplifiers 70, 72, 74, 76, 78, 80, 82, and 84 are not sensed and power consumption is reduced.

Output mode select logic 61 receives the output mode control signal $\overline{BYTE}$ and the extra address signal AM1. Output mode select logic 61 is coupled to Y decoder 60 via line 43 to control the Y decoding in the byte wide output mode.

EPROM 40 includes lower byte output pins $O_0$ through $O_7$ and upper byte output pins $O_8$ through $O_{15}$. The output pins $O_0$ through $O_{15}$ form the word wide output of EPROM 40. Each of blocks 51 through 58 corresponds to one of the lower byte output pins $O_0$ through $O_7$ and one of the upper byte output pins $O_8$ through $O_{15}$. For example, Block 51 corresponds to the $O_0$ output pin and the $O_8$ output pin. In the word wide output mode, both the lower byte output pins $O_0$ through $O_7$ and the upper byte output pins $O_8$ through $O_{15}$ present data for output. Each of the lower byte output pins $O_0$ through $O_7$ is coupled to one of the output buffers 90 through 97. Upper byte output pins $O_8$ through $O_{15}$ are coupled to the output buffers 100 through 107, respectively. Output buffers 100 through 107 are controlled by the $\overline{BYTE}$ signal via line 44. In the word wide output mode, output buffers 100 through 107 are enabled by the $\overline{BYTE}$ signal to allow the transmission of data to the upper byte output pins $O_8$ through $O_{15}$. In the byte wide output mode, output buffers 100 through 107 are disabled by the $\overline{BYTE}$ signal.

During a read operation of EPROM 40, X decoder 59 and Y decoder 60 receive addresses from the address inputs. The data as addressed is read out from memory array 50. The output mode of EPROM 40 is then determined by the $\overline{BYTE}$ signal. When the $\overline{BYTE}$ signal is at Vcc voltage, EPROM 40 enters the word wide output mode. Output buffers 100 through 107 are enabled by the high $\overline{BYTE}$ signal applied via line 44. Output buffers 100 through 107 transmit their respective inputs from the sense amplifiers 70, 72, 74, 76, 78, 80, 82, and 84 to output pins $O_8$ through $O_{15}$. The output pins $O_0$ through $O_{15}$ all present data for output.

In the word wide output mode, output mode select logic 61 couples a logical low BYTE signal to the gates of transistors 62 through 69 via line 42, regardless of the AM1 address input. Transistors 62 through 69 are therefore turned off. Output mode select logic 61 then allows Y decoder 60 to select two bit lines in each of blocks 51 through 58 via Y gating circuitry 86a through 86h, respectively. Each sense amplifier 70 through 85 is then supplied with one bit of the data as addressed in memory array 50. Sense amplifiers 70 through 85 determine the logical value of the data. The data as addressed is then coupled to output buffers 90 through 97 and 100 through 107 from sense amplifiers 70 through 85, and then made available via the output pins $O_0$ through $O_{15}$.

When the $\overline{BYTE}$ signal is at ground level, EPROM 40 enters the byte wide output mode. Output buffers 100 through 107 are disabled by the low $\overline{BYTE}$ signal supplied via line 44. Output buffers 100 through 107 do not pass their inputs to the output pins $O_8$ through $O_{15}$, and only the output pins $O_0$ through $O_7$ present data for output.

In the byte wide output mode, output mode select logic 61 couples a logical high BYTE signal to the gates of transistors 62 through 69, thus turning these transistors on. Meanwhile, the external address signal AM1 is coupled to output mode select logic 61 via the output pin $O_{15}$. With the AM1 signal applied, output mode select logic 61 controls Y decoder 60 so as to select one bit line from each of blocks 51 through 58 for each address applied. For example, output mode select logic 61 controls Y decoder 60 so as to select one bit line in block 51. That bit line is coupled to either the output line 87a or the output line 87b. If the output line 87a is selected, transistor 62 couples line 87a to the output line 87b, given that transistor 62 is turned on in the byte-wide mode. In this way, the signal appearing on line 87a also is applied to sense amplifier 71. Sense amplifier 71 in turn applies its output to output buffer 90. Output buffer 90 applies its output to output/input pin $O_0$. In short, in the byte wide mode, each of the blocks 51 through 58 has one bit of data coupled to one of the output pins $O_0$ through $O_7$ via (1) the odd number sense amplifiers 71, 73, 75, 77, 79, 81, 83, and 85 (2) and output buffers 90 through 97.

In the byte mode, the logical low $\overline{BYTE}$ signal on line 44 also disables the even numbered sense amplifiers 70, 72, 74, 76, 78, 80, 82, and 84. The even numbered sense amplifiers 70, 72, 74, 76, 78, 80, 82, and 84 accordingly do not sense the logical value of the data coupled from blocks 51 through 58 via lines 87a through 89a, respectively. The disabled sense amplifiers 70, 72, 74, 76, 78, 80, 82, and 84 reduce the power consumption of the EPROM 40 in the byte wide output mode.

In the preferred embodiment, transistor 62 through 69 are N-channel transistors. Transistors 62 through 69 have their gates coupled to output mode select logic 61 via line 42. When transistors 62 through 69 are turned on by output mode select logic 61, data applied to the output lines 87a through 89a can be transferred to the output/input pins $O_0$ through $O_7$ via these transistors.

For example, transistor 62 has one end coupled to the output line 87a and another end coupled to the output line 87b. The gate of transistor 62 is coupled to output mode select logic 61 via line 42.

Now assume the output line 87a is selected and the output line 87b is deselected, the output line 87a is then coupled with the data from block 51 as addressed. The data on the output line 87a can be either logical high or logical low. The output line 87b, when deselected, is decoupled to block 51, and therefore is floating. But transistor 62 is turned on and ties the output line 87a to the output line 87b. Therefore, line 87b assumes the logical value (i.e., logical high or low) of the output line 87a. In this case, sense amplifier 70 is disabled, but sense amplifier 71 is enabled. The logical value on line 87b, which is the same as the logical value on line 87a, passed to output buffer 90 and the output/input pin $O_0$.

When line 87a is deselected and line 87b is selected, line 87b is then supplied with the data from block 51 as addressed. Line 87a, when deselected, is decoupled to block 51 and therefore is floating. But transistor 62 is turned on and line 87a assumes the logical value of line 87b. Because sense amplifier 70 is disabled, the output/input pin $O_8$ floats and does not receive the output on line 87a.

Meanwhile, sense amplifier 71 is not disabled. Sense amplifier senses the logical value on line 87b and applies the logical value to the output/input pin $O_0$ via output buffer 90.

The control of output mode select logic 61 over Y decoder 60 described in more detail below.

Figure 3:
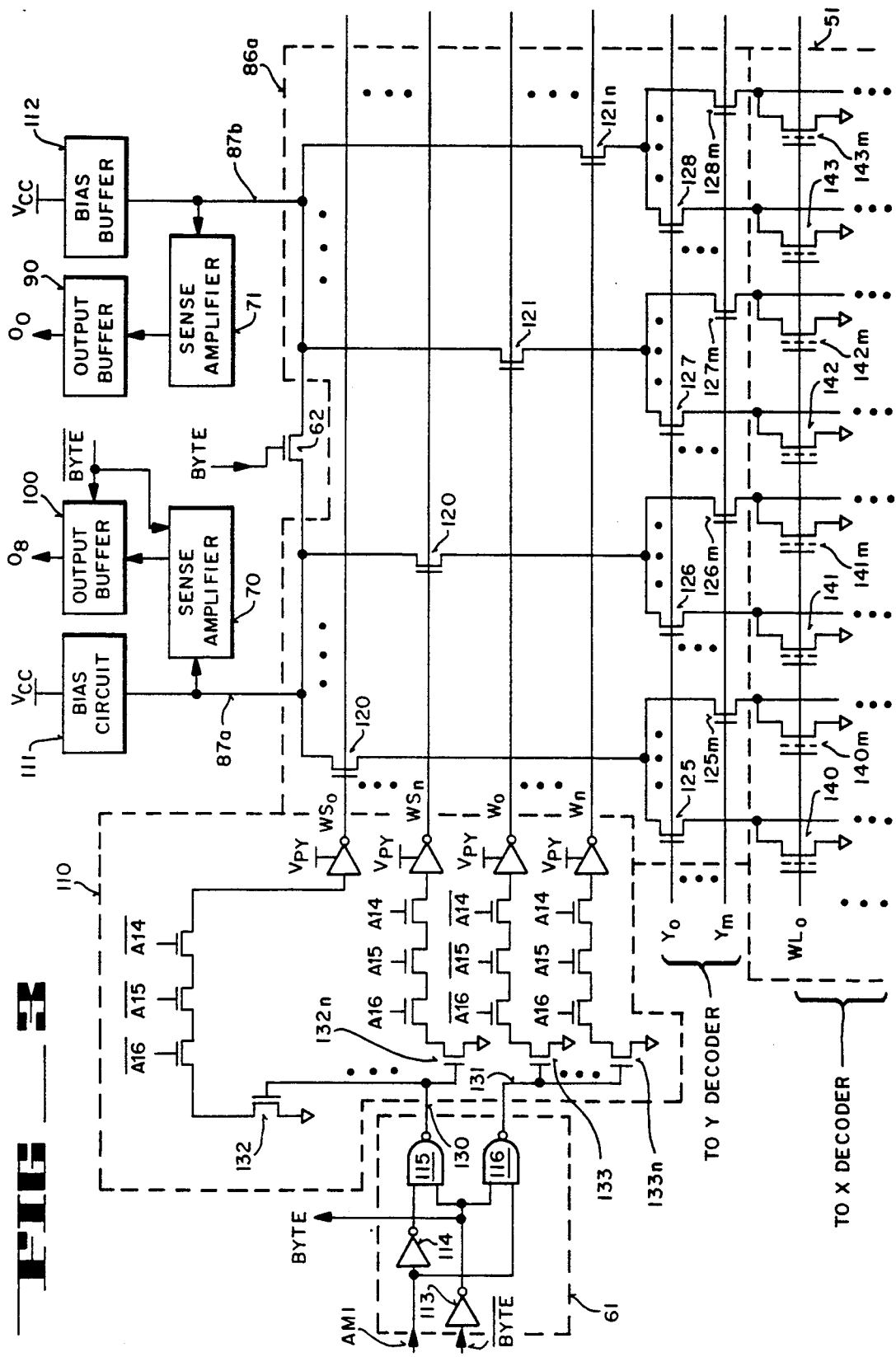
FIG. 3 illustrates circuitry of the output mode select logic, the multiplexer, a portion of the Y decoder, a portion of Y gating circuitry, a portion of the memory array, and two output buffers.

FIG. 3 illustrates circuitry of output mode select logic 61 and the portion of Y decoder 60 that is controlled by output mode select logic 61. In FIG. 3, for illustration purposes only block 51 and its Y gating 86a are shown. Blocks 52 through 58 have an array configuration similar to that of block 51 in FIG. 3. Likewise, Y gatings 86b through 86h are configured similar to Y gating circuitry 86a and are controlled by Y decoder 60 in the same way as that of Y gating 86a.

In FIG. 3, block 51 has its bit lines coupled to Y gating circuitry 86a. Y gating 86a has two stages of Y gating. One stage is controlled by a W decoder 110 of Y decoder 60. The other stage is controlled by the remaining circuitry of Y decoder 60.

W decoder 110 forms part of Y decoder 60 and receives a portion of Y addresses applied at Y decoder 60. W decoder 110 is controlled by output mode select logic 61. W decoder 110 controls the on and off state of transistors 120 through 120n and transistors 121 through 121n of Y gating 86a. Transistors 120 through 120n are coupled to output line 87a and transistors 121 through 121n are coupled to the output line 87b.

Output mode select logic 61 includes inverters 113 and 114 and NAND gates 115 through 116. The $\overline{BYTE}$ signal and the AM1 signal are coupled to inverters 113 and 114, respectively. Output mode select logic 61 is coupled to transistors 132 through 132n of W decoder 110 via line 130, and to transistors 133 through 133n of W decoder via line 131.

When the $\overline{BYTE}$ signal is at the Vcc level, output mode select logic 61 applies the logical high signal on both lines 130 and 131, regardless of the AM1 signal. Transistors 132 through 132n and transistors 133 through 133n are all on. W decoder 110 selectively turns on transistors 120 through 120n and transistors 121 through 121n, depending on Y address inputs A14 till A16. Each of the output lines 87a and 87b of Y gating circuitry 86a is then coupled to a bit line of block 51 via Y gating circuitry 86a.

When the $\overline{BYTE}$ signal is at ground level, the outputs on lines 130 and 131 are determined by the AM1 signal of output mode select logic 61. W decoder 110 is controlled by output mode select logic 61.

If the AM1 signal is logical low, transistors 132 through 132n are switched off by logical low signal on line 130 while transistors 133 through 133n are turned on by the logical high signal on line 131. W decoder 110 turns transistors 120 through 120n of Y gating 86a off. The on and off state of transistors 121 through 121n is determined by the Y addresses A14 through A16 applied to the W decoder 110. The output line 87b is coupled to a bit line at block 51 via one of transistors 121 through 121n.

If the AM1 signal is logical high, transistors 132 through 132n are switched on by this logical high signal on line 130 while transistors 133 through 133n are turned off by the logical low signal on line 131. W decoder 110 turns transistors 121 through 121n of Y gating circuitry 86a off. The on and off state of transistors 120 through 120n is determined by the Y addresses A14 through A16 applied to W decoder 110. The output line 87b is then coupled to a bit line in block 51 via transistor 62 and via one of transistors 120 through 120n.

Figure 4:
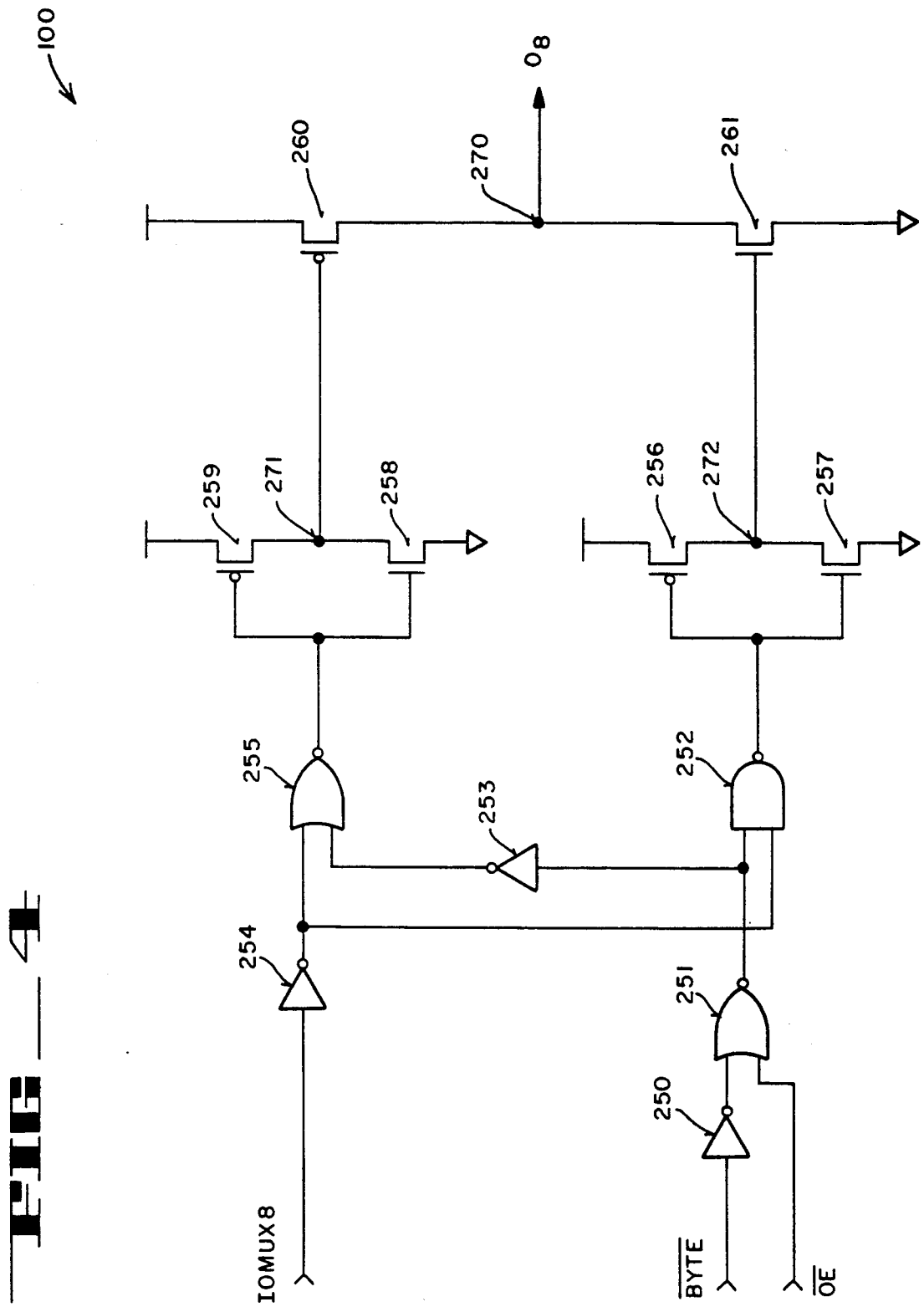
FIG. 4 illustrates circuitry of one output buffer.

FIG. 4 shows the circuit diagram of output buffer 100 of FIGS. 2 and 3. Output buffers 101 through 107 in FIG. 2 have circuitry similar to that of output buffer 100. Output buffers 90 through 97 of FIGS. 2 and 3 are not coupled to the $\overline{BYTE}$ signal, but otherwise are similar in configuration to that of output buffer 100.

In FIG. 4, both the $\overline{BYTE}$ and the $\overline{OE}$ signals control output buffer 100. IOMUX8 represents the input signal of output buffer 100. The IOMUX8 input signal is supplied by sense amplifier 70. A P-channel transistor 260 and a N-channel transistor 261 form the output drive of output buffer 100. The output of to buffer 100 is coupled to output pin $O_8$.

When the $\overline{BYTE}$ signal is at logical low value, NOR gate 251 couples a logical low signal to NAND gate 252 and a logical high signal to a NOR gate 255 via inverter 253. NAND gate 252 outputs a logical high signal to a CMOS inverter formed by P transistor 256 and N transistor 257. NOR gate 255 is also forced to output a logical low signal to a CMOS inverter formed by P transistor 259 and N transistor 258. Node 271 outputs a logical high signal that turns off P transistor 260. Node 272 outputs a logical low signal to turn off N transistor 261. The output pin $O_8$ coupled to node 270 is disabled from performing its output functions.

When the $\overline{BYTE}$ signal is at the logical high level and the $\overline{OE}$ signal is at the logical low level, NOR gate 251 sends a logical high signal to NAND gate 252. NOR gate 251 sends a logical low signal to NOR gate 255 via inverter 253. The IOMUX8 input signal is applied to inverter 254. The output of inverter 254 is connected to as an input to both NAND gate 252 and NOR gate 255. When the IOMUX8 is a logical high, NOR gate 255 outputs a logical high signal to CMOS inverter formed by transistors 258 and 259 and P-channel transistor 260 is ON. Meanwhile, NAND gate 252 couples a logical high signal to CMOS inverter formed by transistors 256 and 257. Transistor 261 is thus turned off. The output $O_8$ at node 270 then outputs a logical high signal.

When the input IOMUX8 signal is at logical low level, NOR gate 255 and NAND gate 252 both output a logical low signal. Therefore, transistor 260 is off and transistor 261 is on. The output $O_8$ at node 270 then outputs a logical low signal.

Figure 5:
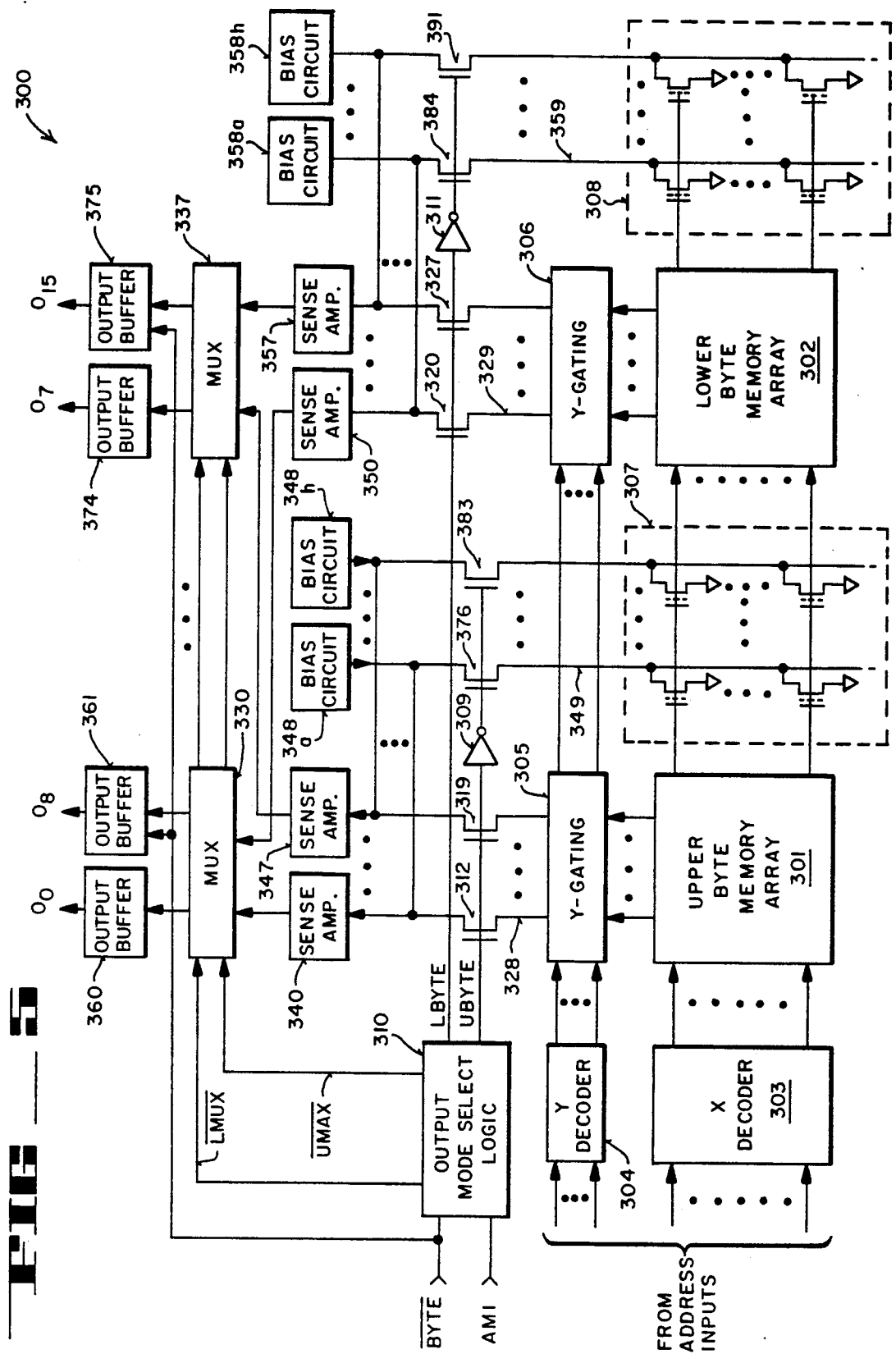
FIG. 5 is a block diagram of another preferred EPROM, and shows two memory arrays, two dummy arrays, output mode select logic, gating transistors, multiplexers, and output buffers.

FIG. 5 illustrates another preferred EPROM 300. In FIG. 5, EPROM 300 includes a lower byte memory array 302 and an upper byte memory array 301. In that preferred embodiment, memory arrays 301 and 302 each store 4 Mbits of data.

An X decoder 303 couples a plurality of word lines to memory arrays 301 and 302. A Y decoder 304 is coupled via Y gatings 305 and 306, respectively, to all bit lines in memory arrays 301 and 302. Both X and Y decoders 303 and 304 receive their addresses from the address inputs. In the preferred embodiment, EPROM 300 includes nineteen address input pins.

Y gating circuitry 305 has eight output lines, each of which is coupled to one of the eight sense amplifiers 340 through 347 via each of eight transistors 312 through 319. For example, Y gating 305 has its output line 328 coupled to sense amplifier 340 via transistor 312. Y gating 306 has eight output lines, each of which is coupled to one of the eight sense amplifiers 350 through 357 via each of the eight transistors 320 through 327. For example, Y gating 306 has its output line 329 coupled to sense amplifier 350 via transistor 320.

Upper byte memory array 301 is powered by bias circuits 348a through 348h via transistors 312 through 319 and Y gating 305. For example, bias circuit 348a is coupled to upper byte memory array 301 via transistor 312. Similarly, lower byte memory array 302 is powered by bias circuits through 358h via the output lines of Y gating 306 and transistors 320 through 327. For example, bias circuit 358a is coupled to lower byte memory array 302 via the output line 329 and transistor 320.

The output of each of sense amplifiers 340 through 347 is coupled to one of eight multiplexers 330 through 337. The output of each of sense amplifiers 350 through 357 is also coupled to each of multiplexers 330 through 337. For example, both sense amplifiers 340 and 350 are coupled to multiplexer 330. Multiplexer 337 is coupled to receive inputs from sense amplifiers 347 and 357. Each of multiplexers 330 through 337 is then coupled to (1) one of the lower byte output pins $O_0$ through $O_7$ and (2) one of the upper byte output pins $O_8$ through $O_{15}$, respectively, via two output buffers. For example, multiplexer 330 is coupled to output pins $O_0$ and $O_8$ via output buffers 360 and 361, respectively.

In the word wide output mode, data as addressed in upper byte memory array 301 is coupled to the upper byte output pins $O_8$ through $O_{15}$. Data as addressed in lower byte memory array 302 is coupled to the lower byte output pins $O_0$ through $O_7$.

In the byte wide output mode, the upper byte output pins $O_8$ through $O_{15}$ are disabled and multiplexers 330 through 337 couple either array 301 or array 302 to the lower byte output pins $O_0$ through $O_7$.

Output mode select logic 310 of EPROM 300 has its UBYTE control signal coupled to the gates of transistors 312 through 319. The LBYTE control signal of output mode select logic 310 is also coupled to the gates of transistors 320 through 327. Output mode select logic 310 also sends a $\overline{LMUX}$ and a $\overline{UMUX}$ control signal to each of multiplexers 330 through 337.

Output mode select logic 310 receives the output mode control signal $\overline{BYTE}$ and the extra address signal AM1. The $\overline{BYTE}$ signal is also applied to odd numbered output buffers 361 through 375 (i.e., output buffers 361, 363, 365, 367, 369, 371, 373, and 375) that are connected with the upper byte number output pins $O_8$ through $O_{15}$. (Output buffers 363, 365, 367, 369, 371, and 373 reside between output buffers 361 and 374 and are not expressly shown in FIG. 5). When the $\overline{BYTE}$ signal is at ground level—which indicates that EPROM 300 is in the byte wide output mode—the low $\overline{BYTE}$ signal disables the odd numbered output buffers 361 through 375.

The circuitry of output mode select logic 310 is further described below.

The circuitry of each of the odd numbered output buffers 361 through 375 is similar to the circuitry of output buffer 100 shown in FIG. 4. Even numbered output buffers 360, 362, 364, 366, 368, 370, 372, and 374 coupled to the lower byte output pins $O_0$ through $O_7$ are not coupled to the $\overline{BYTE}$ signal but are otherwise similar in configuration to output buffer 100 of FIG. 4.

The LBYTE signal is the control signal that allows lower byte memory array 302 to connect with sense amplifiers 350 through 357 via Y gating 306. When the LBYTE is at logical high level, transistors 320 through 327 are all on, and coupled memory array 302 to sense amplifiers 350–357. When the LBYTE signal is logically low, transistors 320 through 327 are all off, and decoupled memory array 302 to sense amplifiers 350–357.

The UBYTE signal is the control signal that allows the upper byte memory array 301 to connect to sense amplifiers 340 through 347. Similarly, when the UBYTE signal is logically high, transistors 312 through 319 are all on and memory array 301 is coupled to sense amplifiers 340 through 347. When the UBYTE signal is logically low, transistors 312 through 319 disconnect memory array 301 from sense amplifiers 340 through 347.

The $\overline{\text{LMUX}}$ and $\overline{\text{UMUX}}$ control signals generated by output mode select logic 310 control each of multiplexers 330 through 337, causing each to selectively couple one of its inputs to its respective lower byte output pins $O_0$ through $O_7$ in the byte wide output mode. For example, in the byte wide output mode and under the control of $\overline{\text{LMUX}}$ and $\overline{\text{UMUX}}$ signals, multiplexer 330 selectively couples the output of either sense amplifier 340 sense amplifier 350 to the output pin $O_0$ via output buffer 360. Likewise, multiplexer 337 selectively couples the output of either sense amplifier 347 or sense amplifier 357 to output pin $O_7$.

In the byte wide output mode, the upper byte output pins $O_8$ through $O_{15}$ do not receive any outputs from their respective output buffers. As described above, output buffers 361, 363, 365, 367, 369, 371, 373, and 375 are disabled by the $\overline{\text{BYTE}}$ signal.

The circuitry of multiplexers 330 through 337 is further described below.

EPROM 300 includes two dummy arrays 307 and 308. Dummy arrays 307 and 308 each includes eight columns of memory cells, all in their erased state (i.e., not programmed). The word lines are also coupled to dummy arrays 307 and 308. Dummy array 307 is powered by bias circuits 348a through 348h via transistors 376 through 383. Dummy array 308 is powered by bias circuits 358a through 358h via transistors 384 through 391. The UBYTE signal is coupled to the gates of transistors 376 through 383 via inverter 309. The LBYTE signal is coupled to the gates of transistors 384 through 391 via inverter 311. When upper byte memory array 301 is coupled to the sense amplifiers 340 through 347, dummy array 307 is decoupled and powered off. When memory array 301 is disconnected from sense amplifiers 340 through 347, dummy array 307 is powered by bias circuits 348a through 348h and is coupled to sense amplifiers 340 through 347.

Likewise, when memory array 302 is coupled to sense amplifiers 350-357, dummy array 308 is decoupled and powered off. When memory array 302 is disconnected from sense amplifiers 350-357, dummy array 308 is powered on by bias circuits 358a through 358h and is coupled to sense amplifiers 350-357.

Dummy array 307 maintains the output lines of Y gating 305 powered up with predetermined data (i.e., logical ones) when memory array 301 is deselected by transistors 312 through 319. In this way, sense amplifiers 340 through 347 can quickly determine the output values of memory array 301 when it is deselected. Therefore, the speed of sense amplifiers 340 through 347 is optimized. Likewise, dummy array 308 maintains the output lines of Y gating 306 powered up with the predetermined data when memory array 302 is deselected by transistors 320 through 327.

As described above, the incorporation of dummy arrays 307 through 308 in EPROM 300 is to increase the speed of EPROM 300. Moreover, the provision of dummy arrays 307 and 308 helps to eliminate undesirable pulses (i.e., glitches) that may occur when either of memory arrays 301 and 302 is coupled from its decoupled state to the lower byte output pins $O_0$ through $O_7$ by output mode select logic 310 in the byte wide output mode.

In operation, when the $\overline{\text{BYTE}}$ signal is at Vcc voltage, which indicates that EPROM 300 is in the word wide output mode, the odd numbered output buffers 361, 363, 365, 367, 369, 371, 373, and 375 are enabled by the high $\overline{\text{BYTE}}$ signal and transmit their inputs to the upper byte output pins $O_8$ through $O_{15}$. Meanwhile, output mode select logic 310 outputs (1) logical high LBYTE and UBYTE signals and (2) logical low $\overline{\text{LMUX}}$ and $\overline{\text{UMUX}}$ signals, regardless of its AM1 input. The logical high LBYTE and UBYTE signals cause memory arrays 301 and 302 to be coupled to respective sense amplifiers 340-347 and 350-357. Dummy arrays 307 and 308 are decoupled. The logical low $\overline{\text{LMUX}}$ and $\overline{\text{UMUX}}$ signals disable the multiplexing function of multiplexers 330 through 337. The data as addressed is coupled to the output pins $O_0$ through $O_{15}$.

When the $\overline{\text{BYTE}}$ signal is at ground level—which indicates that EPROM 300 is in the byte wide output mode—the odd numbered output buffers 361, 363, 365, 367, 369, 371, 373, and 375 are disabled by the $\overline{\text{BYTE}}$ signal. The upper byte output pins $O_8$ through $O_{15}$ thus do not provide data for output. Only the lower byte output pins $O_0$ through $O_7$ provide the byte wide data for output. Output pin $O_{15}$ acts as an input which couples the AM1 signal to output mode select logic 310.

If the AM1 signal is a logical low value, output mode select logic 310 outputs a logical low LBYTE signal and a logical high UBYTE signal to select memory array 301. Output mode select logic 310 further outputs a logical high $\overline{\text{LMUX}}$ signal and a logical low $\overline{\text{UMUX}}$ signal to multiplexers 330-337. This in turn causes the outputs of sense amplifiers 340-347 to be coupled to the lower byte output pins $O_0$ through $O_7$.

If the AM1 signal is logical high, output mode select logic 310 outputs a logical high LBYTE signal and logical low UBYTE signal to select memory array 302. Output mode select logic 310 further outputs a logical low $\overline{\text{LMUX}}$ signal and a logical high $\overline{\text{UMUX}}$ signal to multiplexers 330 through 337. This in turn causes the outputs of sense amplifiers 350-357 to be coupled to the lower byte output pins $O_0$-$O_7$.

Figure 6:
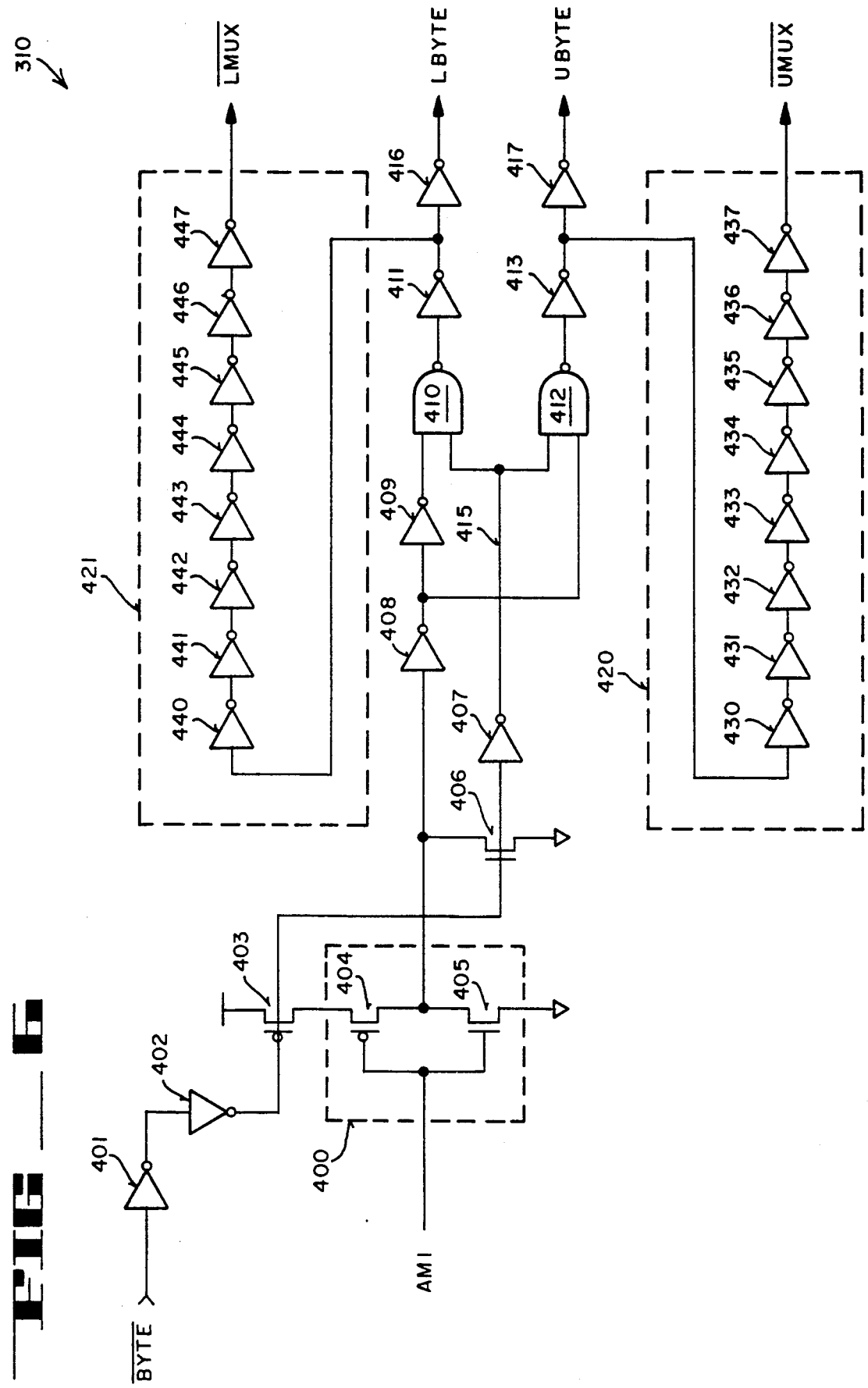
FIG. 6 illustrates circuitry of the output mode select logic of FIG. 5.

FIG. 6 illustrates the circuitry of output mode select logic 310. Output mode select logic 310 includes a CMOS circuit 400, which is formed by P-channel transistor 404 and N-channel transistor 405. CMOS circuitry 400 is coupled to receive the extra address signal AM1. The output of CMOS circuit 400 is coupled to circuitry comprising inverters 408, 409, 411, 413, 416 and 417 and NAND gates 410 and 412. The output of inverter 416 is the LBYTE signal. the output of inverter 417 is the UBYTE signal. The output mode control signal $\overline{\text{BYTE}}$ is coupled to the gate of a P-channel transistor 403 via inverters 401 and 402, and enables CMOS circuit 400. Inverters 401, 402 and 407 lie between the $\overline{\text{BYTE}}$ signal and NAND gates 410 and 412. Thus the $\overline{\text{BYTE}}$ signal serves to control the outputs of output mode select logic 310.

Output mode select logic 310 further includes delay circuits 420 and 421, each comprised of eight inverters. Circuitry 421 includes inverters 440 through 447. Circuitry 420 includes inverters 430 through 437.

In alternative embodiments, delay circuits 420 and 421 can be implemented with other circuits that perform the same function. For example, a counter may be employed to replace the inverters in each of delay circuits 420 and 421.

Delay circuit 420 outputs the $\overline{\text{UMUX}}$ signal and delay circuit 421 outputs the $\overline{\text{LMUX}}$ signal. The $\overline{\text{LMUX}}$ signal is the delayed and inverted version of the LBYTE signal. the $\overline{\text{UMUX}}$ signal is the delayed and inverted version of the UBYTE signal.

When the control signal $\overline{\text{BYTE}}$ is at Vcc level, transistor 403 is turned off. The output of CMOS circuit 400 is forced to ground by N-channel transistor 406, which is turned on by the high $\overline{\text{BYTE}}$ signal. Meanwhile, the high $\overline{\text{BYTE}}$ signal is further inverted to low by logical inverter 407, and is applied to NAND gates 410 and 412 via line 415. The logical low signal on line 415 forces NAND gates 410 and 412 both to output logical high signals. Inverter 416 then outputs a logical high LBYTE signal. Inverter 417 outputs a logical high UBYTE signal. After certain delays, delay circuits 421 and 420 output logical low $\overline{\text{LMUX}}$ and $\overline{\text{UMUX}}$ signals, respectively.

When the $\overline{\text{BYTE}}$ signal is at ground level, transistor 403 is turned on. This enables CMOS circuit 400, which receives the extra address signal AM1. The low $\overline{\text{BYTE}}$ signal is inverted 407 and applied to NAND gates 410 and 412 via line 415. NAND gates 410 and 412 are no longer forced into a logical high output state.

The output signals UBYTE, LBYTE, $\overline{\text{UMUX}}$, and $\overline{\text{LMUX}}$ are determined by the value of the extra address signal AM1. If the AM1 signal is at logical high level, CMOS circuit 400 applies a logical low signal to inverter 408. NAND gate 410 then outputs a logical high signal, which becomes the logical high LBYTE signal after passing through inverters 411 and 416. NAND gate 412 outputs a logical low signal, which then becomes the logical low UBYTE signal after passing through inverters 413 and 417. The output of inverter 411 is also applied to delay circuit 421, which then outputs a logical low $\overline{\text{LMUX}}$ signal. The output of inverter 413 is also applied to delay circuit 420, which then outputs a logical high $\overline{\text{UMUX}}$ signal.

The logical high LBYTE signal couples the low byte memory array 302 to multiplexers 330-337 of FIG. 5. The logical low UBYTE signal decouples the upper byte memory array 301 from multiplexers 330-337. The logical low $\overline{\text{LMUX}}$ and logical high $\overline{\text{UMUX}}$ signals control multiplexers 330-337 of FIG. 5 such that lower byte memory array 302 is coupled to output pins $O_0$ through $O_7$.

If the extra address signal AM1 is at logical low level, CMOS circuit 400 applies a logical high signal to inverter 408. NAND gate 410 then outputs a logical low signal, which becomes the logical low LBYTE signal. Inverter 417 outputs a logical high UBYTE signal. The $\overline{\text{LMUX}}$ signal is thus at a logical high level and the $\overline{\text{UMUX}}$ signal is at a logical low level. Upper byte memory array 301 is coupled through multiplexers 330 through 337 to the output pins $O_0$ through $O_7$. Lower byte memory array 302 is decoupled.

FIG. 7 illustrates the circuit diagram of multiplexer 330 of FIG. 5. Multiplexers 331 through 337 of FIG. 5 have circuitry similar to that of multiplexer 330.

Multiplexer 330 of FIG. 7 receives the control signals $\overline{\text{LMUX}}$ and $\overline{\text{UMUX}}$. The $\overline{\text{UMUX}}$ signal is applied to (1) a P-channel transistor 503 via inverters 501 and 502 and (2) to a N-channel transistor 506 via inverter 501. The $\overline{\text{UMUX}}$ signal controls the on-off state of transistors 503 and 506, which in turn controls the on-off state of circuit branch 500. Circuit branch 500 further includes a CMOS inverter formed by P-channel transistor 504 and N-channel transistor 505. SOUT8 is the output from sense amplifier 340 and is applied to the CMOS inverter. The output of circuit branch 500 is connected to inverter 507. The output of inverter 507 is the MOUT8 signal.

The $\overline{\text{LMUX}}$ signal is applied to transistors 514 and 517 of circuit branch 520 via inverters 511 and 512. Circuit branch 520 further includes a CMOS inverter formed by transistors 515 and 516. The $\overline{\text{LMUX}}$ signal controls the on-off state of transistors 514 and 517, which in turn control the on-off state of circuit branch 520. SOUT$\emptyset$ is the output of sense amplifier 350. SOUT$\emptyset$ is coupled to the gates of transistors 515 and 516. The output of branch 520 is connected to inverter 518. The output of inverter 518 is the MOUT$\emptyset$ signal.

N and P transistors 522 and 523 are coupled between node 510 and node 530. Their gates are controlled by the $\overline{\text{UMUX}}$ signal and the $\overline{\text{LMUX}}$ signal via inverters 501 and 511, respectively, and via NAND gate 521 and inverter 524.

During operation, when both the $\overline{\text{LMUX}}$ and $\overline{\text{UMUX}}$ signals are at a logical low level, NAND gate 521 couples a logical low signal to the gate of N transistor 522 and a logical high signal to P transistor 523 via inverter 524. Both transistors 522 and 523 are turned off.

Circuit branches 500 and 520 are enabled by the logical low $\overline{\text{LMUX}}$ and $\overline{\text{UMUX}}$ signals. The SOUT8 input signal is coupled to circuit branch 500. SOUT$\emptyset$ is coupled to circuit branch 520.

The MOUT0 output represents either SOUT0 or SOUT8, depending on the logical level of the $\overline{\text{UMUX}}$ signal and the $\overline{\text{LMUX}}$ signal. When the $\overline{\text{LMUX}}$ signal is at logical low while the $\overline{\text{UMUX}}$ is at logical high, circuit branch 520 is enabled to receive the SOUT0 input while circuit branch 500 is disabled. In this case, the MOUT0 output is supplied with the SOUT0 signal. When the $\overline{\text{UMUX}}$ signal is at logical low while the $\overline{\text{LMUX}}$ signal is at logical high, circuit branch 500 is enabled to receive SOUT8 signal while circuit branch 520 is disabled. In this case, the MOUT0 output is supplied with the SOUT8 signal via the ON transistors 522 and 523. Although the MOUT8 output is also coupled to receive the SOUT8 signal, output buffer 361 coupled to receive the MOUT8 signal is disabled by the logical low $\overline{\text{BYTE}}$ signal.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device, comprising:
   (A) a memory array that includes
      (i) a first block;
      (ii) a second block;
   (B) a first output pin;
   (C) a second output pin;
   (D) multiplexing means for selectively coupling the first block and the second block to the first output pin and the second output pin;
   (E) decoding means coupled to the memory array for addressing the memory array with an address, wherein the address is applied as an input of the decoding means;

(F) a control input for receiving a control signal, wherein the control signal can be in a first voltage state and a second voltage state; and (G) output mode select means coupled to receive the control signal for controlling the multiplexing means and the decoding means, wherein when the control signal is in the first voltage state, the output mode select means controls the multiplexing means to couple the first block to the first output pin and the second block to the second output pin, and controls the decoding means to address both of the first block and the second block, wherein the output mode select means is coupled for receiving a first input signal from the second output pin for controlling the multiplexing means to selectively couple the first and the second block to the first output pin and th decoding means to selectively address one of the first and the second block when the control signal is in the second voltage state.

2. The memory device of claim 1, wherein the first input signal can be in a third voltage state and a fourth voltage state, wherein when the control signal is in the second voltage state, the output mode select means controls (1) the decoding means to address the first block and the multiplexing means to couple the first block to the first output pin when the first input signal is in the third voltage state, and (2) the decoding means to address the second block and the multiplexing means to couple the second block to the first output pin when the first input signal is in the fourth voltage state.

3. The memory device of claim 2, wherein the first voltage state is ground, the second voltage state is approximately 5 volts, the third voltage state is logical low level, and the fourth voltage state is logical high level.

4. The memory device of claim 1, further comprising a third output pin and a fourth output pin, wherein the memory array further includes a third block corresponding to the third output pin, and a fourth block corresponding to the fourth output pin, wherein the output mode select means controls the multiplexing means to selectively couple one of the first block, the second block, the third block and the fourth block to the first output pin when the control signal is in the second voltage state, wherein when the control signal is in the first voltage state, the output mode select means controls the multiplexing means to couple the first block to the first output pin, the second block to the second output pin, the third block to the third output pin, and the fourth block to the fourth output pin.

5. The memory device of claim 4, wherein the output mode select means is further coupled to receive a second input signal from the third output pin when the control signal is in the second voltage state, wherein the second input signal can be in the third voltage state and the fourth voltage state.

6. The memory device of claim 5, wherein when the control signal is in the second voltage state, the output mode select means controls (1) the decoding means to address the first block and the multiplexing means to couple the first block to the first output pin when the first input signal and the second input signal are both in the third voltage state, (2) the decoding means to address the second block and the multiplexing means to couple the second block to the first output pin when the first input signal is in the third voltage state and the second input signal is in the fourth voltage state, (3) the decoding means to address the third block and the multiplexing means to couple the third block to the first output pin when the first input signal is in the fourth voltage state and the second input signal is in the third voltage state, and (4) the decoding means to address the fourth block and the multiplexing means to couple the fourth block to the first output pin when the first input signal and the second input signal are both in the fourth voltage state.

7. The memory device of claim 1, further comprising a first plurality of output pins, including the first output pin, and a second plurality of output pins, including the second output pin, wherein the memory array further includes a first plurality of blocks, including the first block, and a second plurality of blocks, including the second block, wherein each of the first plurality of blocks corresponds to each of the first plurality of output pins, wherein each of the second plurality of blocks corresponds to each of the second plurality of output pins.

8. The memory device of claim 1, wherein the memory array includes a plurality of electrically programmable nonvolatile memory cells.

9. The memory device of claim 1, wherein the memory array includes a plurality of electrically erasable and electrically programmable nonvolatile memory cells.

10. The memory device of claim 1, wherein the multiplexing means is a transistor, wherein the transistor couples the second block to the first output pin when the transistor is turned on by the output mode select means.

11. The memory device of claim 1, further comprising a first sense amplifier coupled to the first block, and a second sense amplifier coupled to the second block, wherein the output mode select means disables the second sense amplifier when the control signal is in the second voltage state.

12. The memory device of claim 1, further comprising an output buffer coupled between the second output pin and the second block, wherein the output mode select means disables the output buffer when the control signal is in the second voltage state.

13. A memory device, comprising:

(a) a first memory array;
(b) a second memory array;
(c) a first plurality of output pins;
(d) a second plurality of output pins;
(e) circuitry means coupled to the first memory array, the second memory array, the first plurality of output pins, and the second plurality of output pins for selectively coupling the first memory array and the second memory array to the first and the second plurality of output pins;
(f) a control input for receiving a control signal, wherein the control signal can be in a first voltage state and a second voltage state; and
(g) output mode select means coupled to receive the control signal, and to the circuitry means for controlling the circuitry means, wherein when the control signal is in the first voltage state, the output mode select means controls the circuitry means to couple the first memory array to the first plurality of output pins and the second memory array to the second plurality of output pins, wherein when the control signal is in the second voltage state, the output mode select means controls the circuitry means to couple one of the first memory array and the second memory array to the first plurality of output pins, wherein the output mode select means receives an input signal from one of the second plurality of output pins when the control signal is in the second voltage state, wherein the input signal can be logical low and logical high, wherein when the input signal is logical low, the output mode select means controls the circuitry means to couple the first memory array to the first plurality of output pins, wherein when the input signal is logical high, the output mode select means controls the circuitry means to couple the second memory array to the first plurality of output pins.

14. The memory device of claim 13, wherein the circuitry means decouples the second memory array to the first and the second plurality of output pins when the input signal is logical low and the control signal is in the second voltage state, and decouples the the first memory array to the first plurality of output pins when the input signal is logical high and the control signal is in the second voltage state.

15. The memory device of claim 14, wherein the circuitry means further includes multiplexing means, wherein the output mode select means controls the multiplexing means to selectively couple one of the first and the second memory array to the first plurality of output pins when the control signal is in the second voltage state.

16. The memory device of claim 13, wherein the first memory array further includes a first plurality of memory columns coupled to the circuitry means, and the second memory array further includes a second plurality of memory columns coupled to the circuitry means, wherein when the circuitry means decouples the first memory array, the circuitry means couples the first plurality of columns to the multiplexing means, wherein when the circuitry means decouples the second memory array, the circuitry means couples the second plurality of columns to the multiplexing means.

17. The memory device of claim 13, wherein the memory array includes a plurality of electrically erasable and electrically programmable non-volatile memory cells.

18. The memory device of claim 13, wherein the memory array includes a plurality of electrically programmable non-volatile memory cells.

19. The memory device of claim 13, further comprising an output buffer coupled between the second plurality of output pins and the circuitry means, wherein the output mode select means disables the output buffer when the control signal is in the second voltage state.

20. The memory device of claim 13, wherein the first voltage state is ground, the second voltage state is approximately 5 volts.

21. A method of controlling a memory device to switch between a first output mode and a second output mode, comprising the steps of:
(a) applying a control signal to the memory device, wherein the control signal can be in a first voltage state and a second voltage state, wherein the memory device includes a first block and a second block, a first output pin and a second output pin, wherein the memory device is in the first output mode when the control signal is in the first voltage state, wherein the memory device is in the second output mode when the control signal is in the second voltage state;
(b) determining the voltage state of the control signal applied to the memory device by a output mode select means;
(c) if the control signal is in the first voltage state, then coupling the first output pin to the first block and the second output pin to the second block by a multiplexing means and allowing both the first and the second block to be addressable;
(d) if the control signal is in the second voltage state, then
(i) receiving a first input signal from the second output pin by the output mode select means, wherein the first input signal can be in a third voltage state and a fourth voltage state; and
(ii) controlling (1) a decoding means to address the first block and the multiplexing means to couple the first block to the first output pin by the output mode select means when the first input signal is in the third voltage state, and (2) controlling the decoding means to address the second block and the multiplexing means to couple the second block to the first output pin when the first input signal is in the fourth voltage state.

22. The method of claim 21, wherein the first voltage state is ground, the second voltage state is approximately 5 volts, the third voltage state is logical low level, and the fourth voltage state is logical high level.

23. The method of claim 21, wherein the step (d) further comprises the step of disabling a second output buffer coupled to the second output pin.

* * * * *